(12) United States Patent
Morimoto

(10) Patent No.: US 6,310,798 B1
(45) Date of Patent: Oct. 30, 2001

(54) SEMICONDUCTOR MEMORY AND METHOD FOR MANUFACTURE THEREOF

(75) Inventor: Rui Morimoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/513,848

(22) Filed: Feb. 25, 2000

(30) Foreign Application Priority Data

Aug. 25, 1999 (JP) ................................. 11-238981

(51) Int. Cl.[7] ........................... G11C 11/38; G11C 11/40
(52) U.S. Cl. ........................ 365/159; 305/148; 305/175
(58) Field of Search .................... 365/159, 175, 365/148, 71; 257/104, 105, 106, 903, 904

(56) References Cited

U.S. PATENT DOCUMENTS

| | | | |
|---|---|---|---|
| 5,390,145 | * 2/1995 | Nakasha et al. | 365/159 |
| 5,684,737 | * 11/1997 | Wang et al. | 365/175 |
| 5,825,687 | * 10/1998 | Yin | 365/175 |
| 5,838,609 | * 11/1998 | Kuriyama | 365/159 |

FOREIGN PATENT DOCUMENTS 61-240498    10/1986    (JP) .

OTHER PUBLICATIONS

"High Performance CMOS Compatible Bistable Operation at Extremely Low Supply Voltage by a Novel Si Interband Tunneling Diode", K. Morita et al., 56th Annual Device Research Conference University of Virginia, Jun. 22–24, 1998, pp. 42–43.

* cited by examiner

Primary Examiner—Son Mai
(74) Attorney, Agent, or Firm—McDermott, Will & Emery

(57) ABSTRACT

A semiconductor memory which can secure the stability of data holding characteristics and data read/write characteristics for a tunnel diode having a small peak/valley ratio, and to provide a method for manufacturing such a semiconductor memory. The peak/valley ratio of a tunnel diode can be improved by arranging a tunnel insulating film on the bottom portion of the ground direct contact forming the tunnel diode; the resistance of high resistance load can further be increased by arranging a tunnel insulating film on the bottom portion of the storage node direct contact; and data holding characteristics can be improved while controlling the column current by setting the power voltage impressed to the high resistance load higher than the power voltage impressed to the bit line. Stable data read/write characteristics can be secured while controlling the column current by increasing drain resistance by utilizing the drain region side of the access transistor as a P$^-$-type active region, and by arranging a tunnel insulating film on the bottom portion of the bit-line direct contact.

20 Claims, 10 Drawing Sheets

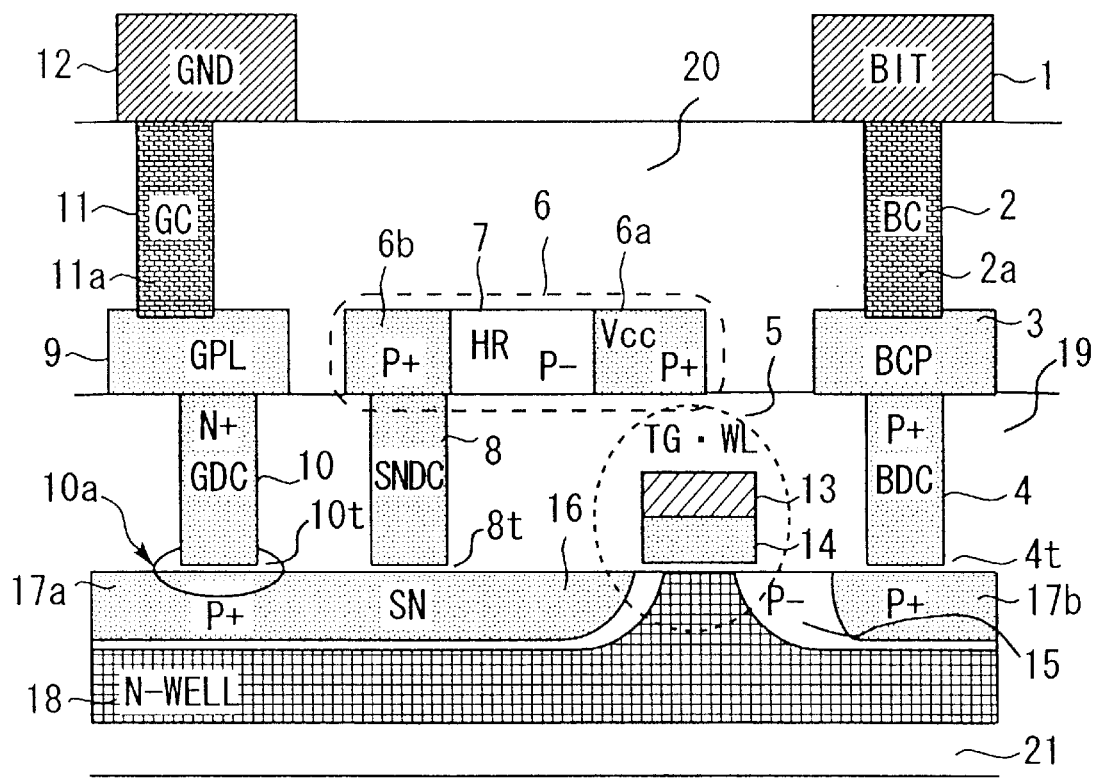

SEMICONDUCTOR MEMORY AND METHOD FOR MANUFACTURE THEREOF

BACKGROUND OF THE INVENTION

1. Field of the Invention

The present invention relates to a semiconductor memory and a method for the manufacture thereof, and in particular to a static random access memory (SRAM) using a negative resistance element, and a method for the manufacture thereof.

2. Description of Related Art

The chip area of a semiconductor memory such as SRAM for data storage tends to widen in proportion to the storage capacity thereof. Since widening of the chip area leads to decrease in yield and increase in costs, it is extremely important to reduce the area of a memory cell which is a constituting unit of a memory such as SRAM.

As well as the above-described SRAMs, a large variety of memories such as dynamic random access memories (DRAMs), and electrically erasable programmable read only memories (EEPROMs),are available; however, DRAMs have frequently been used as memories of large capacities. Since the advantages of DRAMs are that a memory cell can be constituted by one capacitor and one transistor, and that the writing speed is high in comparison with EEPROMs, DRAMs have been used most frequently in various electronic applications.

However, DRAMs have a problem that the further shrinkage of the area of memory cells is difficult. The reason is that although data are stored in a DRAM by accumulating electric charge in a capacitor, it is difficult to reduce the size of the capacitor to meet the size reduction required by design standard or design rule in device process design.

In order to solve such a problem, a capacitor utilizing a highly dielectric film, such as BST, has been proposed, but it is still in the study stage, and is not yet practical.

Furthermore, although a system LSI in which a single chip realized system functions which had been performed by a plurality of ICs or LSIs has possibility of increasing the mode using memory cells in system LSIs, such LSIs have a problem of deteriorating the flatness of interlayer insulating films used in the interfaces of the memory cell array and other logic regions interfering with patterning and the like when a DRAM using a stack-type capacitor is used.

On the other hand, since an SRAM, in particular a full complementary metal oxide semiconductor (CMOS) type SRAM has a memory cell structure other than interconnections formed on a substrate, it has less problems of the deterioration of flatness of interlayer insulating films than the above-described DRAM using a stack-type capacitor. However, since a full CMOS-type SRAM has six transistors formed on the substrate: two access transistors, two driver transistors, and two loading transistors, the area of the memory cells is inevitably widened in comparison with a DRAM.

In order to solve the above-described problem of widening of memory cells, an SRAM using a negative resistance has been proposed. Since this type of SRAM is a negative resistance element called a tunneling diode, a high resistance loading element, and an MOS-type transistor element called an access transistor, an SRAM memory cell can be formed only by these three elements. On the other hand, since the tunneling diode is required to have a steep PN junction, it cannot tolerate heat treatment during the CMOS process, and the realization of such an SRAM has been considered to be difficult; however, a method for manufacturing a high-performance tunneling diode by inserting an oxide film between the PN junction of the tunneling diode for controlling the thermal scattering of impurities has recently been proposed. (K. Morita, et al., "High Performance CMOS Compatible Bistable Operation at Extremely Low Supply Voltage by a Novel Si Interband Tunneling Diode," 56th Annual DEVICE RESEARCH CONFERENCE (DRC), Extended Abstracts, pp. 42–43)

However, the operation of the tunneling diode manufactured by the above-described method has not been reported. Furthermore, in the voltage-current characteristics of the tunneling diode, the ratio of the local maximum value at a low voltage (hereafter referred to as "peak value") to the local minimum value at a high voltage (hereafter referred to as "valley value") (hereafter referred to as "peak/valley ratio") is as small as about 2. Therefore, there has been a problem that an SRAM using such a tunneling diode suffers from the lack of data holding stability.

Since a full CMOS-type SRAM has six transistors formed on a substrate, as described above, there has been a problem of the inevitably widened memory cell area in comparison with the memory cell area of a DRAM. A tunneling diode developed for solving such a problem has a small peak/valley ratio, and there has been a problem of the lack of data holding stability. Furthermore, the above-described tunneling diode has another problem that if the column current of the bit line or the like selecting a memory cell is unnecessarily large, data of the bit selected on reading are broken, and it is difficult to secure stable data read/write characteristics.

SUMMARY OF THE INVENTION

Therefore, in order to solve above-described problems, an object of the present invention is to provide a semiconductor memory with a memory cell area narrowed by elevating bit density per unit area, and a method for manufacturing such a semiconductor memory.

Another object of the present invention is to provide a semiconductor memory that can improve data holding stability even with a tunneling diode having a small peak/valley ratio, and can secure stable data read/write characteristics by controlling the column current, and a method for manufacturing such a semiconductor memory.

According to a first aspect of the present invention, there is provided a semiconductor memory selected by a bit line and a word line comprising: an access transistor whose source-drain region side is connected to the bit line and whose gate side is connected to the word line; a loading resistor connected between the power source and a storage node on the drain region side of the access transistor; and a negative resistor portion connected between ground and the storage node on the drain region side of the access transistor, the negative resistor portion having a tunnel insulating film producing the tunnel effect and formed on the p-type active region with a relatively high impurity concentration, and n-type polysilicon formed in the tunnel insulating film.

According to a second aspect of the present invention, there is provided a semiconductor memory comprising a semiconductor substrate of the first conductivity type; a well of the second conductivity type formed on the main surface of the semiconductor substrate of the first conductivity type; a first active region of the first conductivity type formed on the well of the second conductivity type, and having a relatively high impurity concentration; an access transistor whose source region side is connected to the storage node formed in the first active region; a second active region of the first conductivity type formed on the well of the second conductivity type other than the area of the first active region and the access transistor, and having a relatively high impurity concentration; a storage node direct contact formed on the upper portion of the storage node; a loading resistor connected between the storage node and the power line; a bit-line direct contact formed on the upper portion of the second active region; a bit line formed through the bit-line direct contact; a ground direct contact formed on the upper portion of the first active region; a polysilicon ground wiring formed by forming a polysilicon film on the ground direct contact; a ground contact placed on the polysilicon ground wiring; and a ground line formed on the ground contact, wherein a tunnel insulating film producing the tunneling effect is provided on the bottom portion of the ground direct contact.

According to a third aspect of the present invention, there is provided a method for manufacturing a semiconductor memory comprising steps of: arranging an array of active regions isolated by field oxide films on the main surface of a semiconductor substrate of the first conductivity type; forming a well of the second conductivity type on the active regions; forming access transistors also functioning as a word line in parallel to each other on an overhang portion and the other overhang portion of each of the active regions formed in an array; forming a region of the first conductivity type having a relatively low impurity concentration on the drain region side of the access transistor; forming a first active region of the first conductivity type having a relatively high impurity concentration on one of the wells of the second conductivity type other than the area of the region of the first conductivity type having a relatively low impurity concentration, and forming a second active region of the first conductivity type having a relatively high impurity concentration on the other of the wells of the second conductivity type; forming a storage node in the first active region; simultaneously opening a ground direct contact on the upper portion of the first active region, a storage node direct contact on the upper portion of the storage node and a bit-line direct contact on the upper portion of the second active region; forming a tunnel insulating film producing the tunnel effect on the bottom portion of each of the ground direct contact, the storage node direct contact and the bit-line direct contact; forming a non-doped polysilicon film on the ground direct contact, the storage node direct contact and the bit-line direct contact, the non-doped polysilicon film formed on the ground direct contact is changed to the second conductivity type having a relatively high impurity concentration to form a ground polysilicon wiring, a part of the non-doped polysilicon film formed on the storage node direct contact is changed to the first conductivity type having a relatively low impurity concentration to form a loading resistor, other part is changed to the first conductivity type having a relatively high impurity concentration to form a power line, the non-doped polysilicon film formed on the bit-line direct contact is changed to the first conductivity having a relatively high impurity concentration to form a bit-line contact pad, and forming the ground polysilicon wiring, the loading resistor, the power line and the bit-line contact pad on the same layer; and forming a tunnel diode on the bottom portion of the ground direct contact.

The above and other objects, effects, features and advantages of the present invention will become more apparent from the following description of the embodiments thereof taken in conjunction with the accompanying drawings.

BRIEF DESCRIPTION OF THE DRAWINGS

FIGS. 8A and 8B through 12A and 12B are diagrams showing a method (process flow) for manufacturing a semiconductor memory according to Embodiment 4 of the present invention.

FIGS. 8A and 8B show P-type active regions 21 (silicon substrates) which are separated by field oxide films 22, and P-type active regions 21 each having a T-shape configuration are arrayed.

FIGS. 12A and 12B show a second interlayer insulating film 20 which is formed over bit-line contact pads BCP 3, high resistance loads HR 7, power lines Vcc 6 and ground polysilicon lines GPL 9 and the like.

DETAILED DESCRIPTION OF THE PREFERRED EMBODIMENTS

Figure 1:
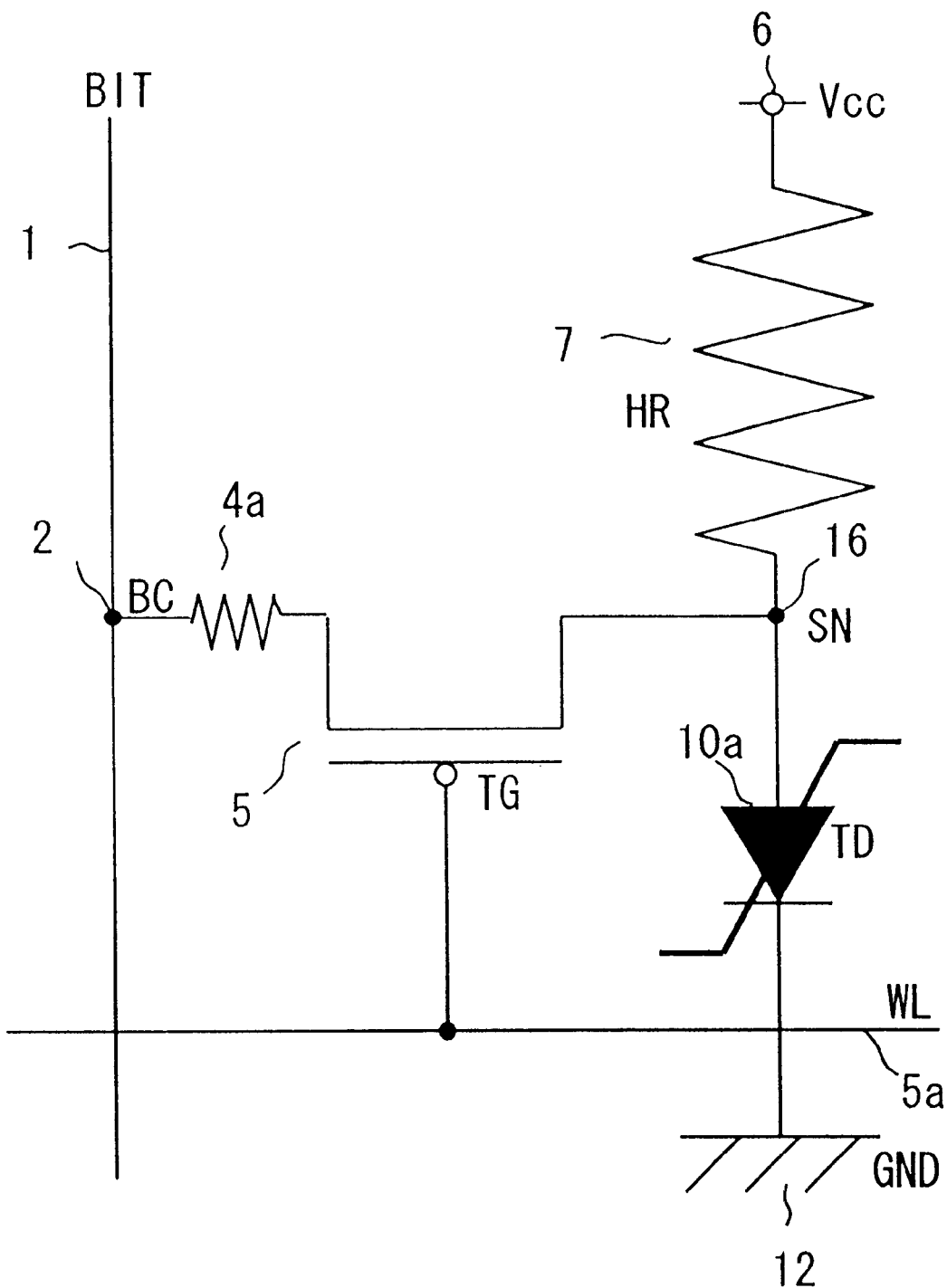
FIG. 1 is an equivalent circuit showing a semiconductor memory according to Embodiment 1 of the present invention.

Embodiments of the present invention will be described below with reference to the accompanying drawings. It is noted that the same reference symbols in the drawings denote the same or corresponding components.

Embodiment 1

FIG. 1 is an equivalent circuit showing a semiconductor memory according to Embodiment 1 of the present invention, that is an SRAM memory cell utilizing a negative resistance tunneling diode.

In FIG. 1, 1 is a bit line BIT, 2 is a bit line contact BC, 5 is an access transistor TG, 5a is a word line WL, 6 is a power line Vcc, 16 is a storage node SN, 7 is a high-resistance load HR connected between the power line Vcc 6 and the storage node SN 16, 12 is ground, and 10a is a tunneling diode TD connected between the storage node SN 16 and ground 12. In the SRAM utilizing the tunneling diode TD 10a, information is accumulated in the storage node SN 16. The symbol 4a represents a bit-line contact resistor.

Figure 2:
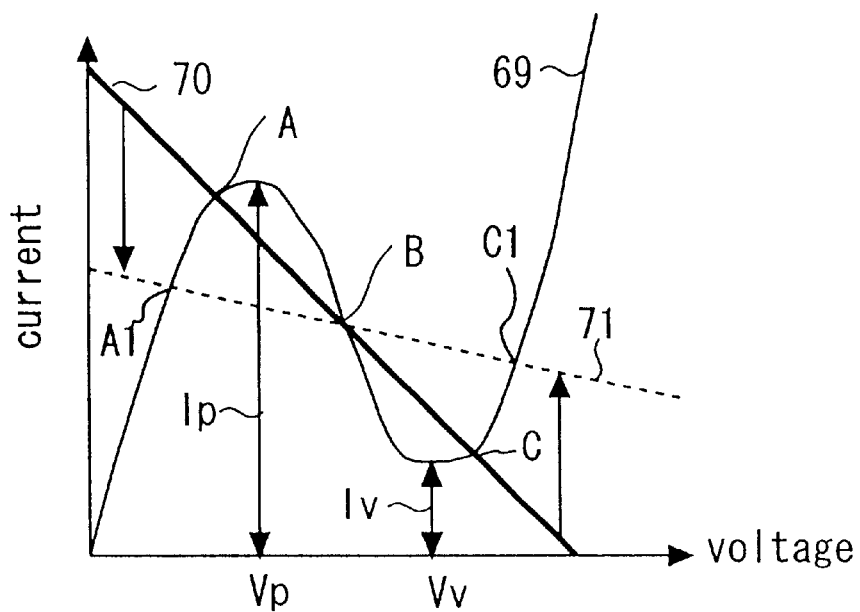
FIG. 2 is a graph showing the operation principle of the SRAM utilizing the tunneling diode TD 10a according to Embodiment 1 of the present invention.

FIG. 2 is a graph showing the operation principle of the SRAM utilizing the tunneling diode TD 10a according to Embodiment 1 of the present invention. In FIG. 2, the abscissa shows the voltage of the storage node SN 16 against ground 12, the ordinate shows current flowing through the tunneling diode TD 10*a* or the high-resistance load HR 7. The symbol 69 is the tunneling diode current flowing through the tunneling diode TD 10*a*, 70 is load current flowing through the high-resistance load HR 7, and 71 is load current flowing through the high-resistance load HR in case of considering a counterplan for the stabilisation of data holding. In the data holding state, the potential of the storage node SN 16 is determined by the balance of the load current 70 supplied by the high-resistance load HR 7 and the tunneling diode current 69 flowing through the tunneling diode TD 10*a*. Since the tunneling diode TD 10*a* has negative resistance characteristics, the balancing points (stable points) where the load current curve 70 intersects the tunneling diode current curve 69 are present at three points of A, B, and C as FIG. 2 shows. Since only two of these points (two values, for example, Point A and Point C) have direct relationship to data holding characteristics, in an SRAM utilizing the tunneling diode TD 10*a*, eventually two elements, the high resistance load HR 7 and the tunneling diode TD 10*a* can store the two-value data. As the result, the chip size can be reduced, and cost reduction can be achieved. When the peak current (Ip)/valley current (Iv) ratio, which is the ratio of the peak current Ip (voltage Vp) showing the local maximum to the valley current Iv (voltage Vv) showing the local minimum in the tunneling diode current 69 is not relatively large, the curve of the load current shifts from the curve 70 to the curve 71 by elevating the resistance of the high resistance load HR 7 and the voltage of the power line Vcc 6. Therefore, since the gradient of the load current against the potential of the storage node SN 16 is reduced, the stable point A shifts to A1 and the stable point C shifts to C1 widening voltage difference between the two stable points (two values) in comparison with the case of the curve 70. As the result, static noise margin and data holding characteristics can be improved. Alternatively, a storage node direct contact SNDC resistor can be provided between HR 7 and SN 16 of FIG. 1 to increase the resistance of the load HR 7.

Figure 3:
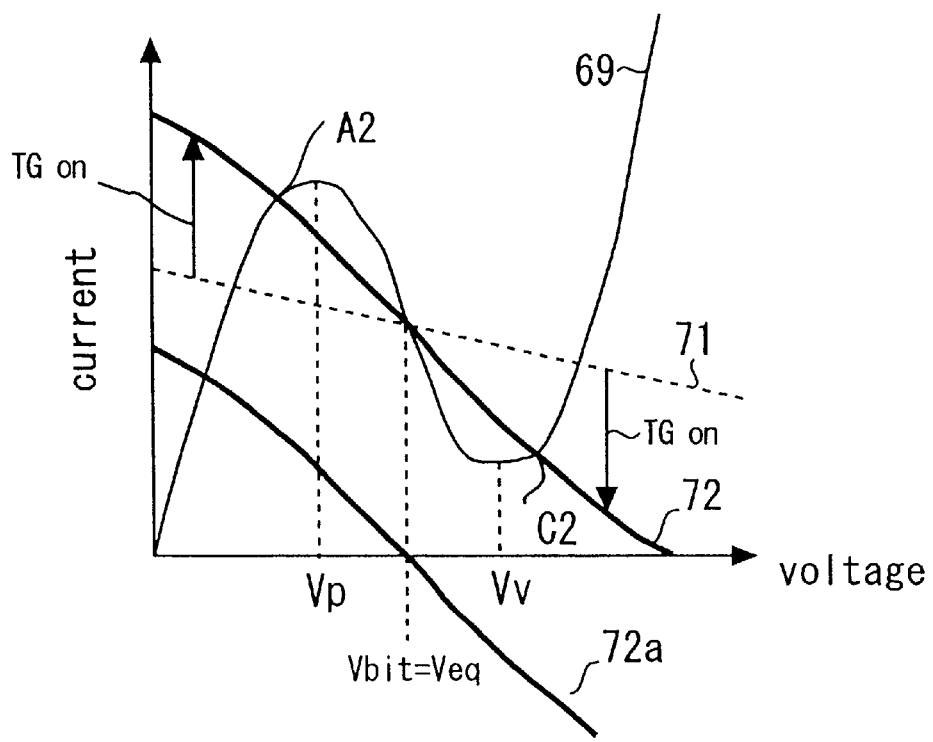
FIG. 3 shows a method for reading data stored in an SRAM using the tunneling diode TD 10a in Embodiment 1 of the present invention.

FIG. 3 shows a method for reading data stored in an SRAM using the tunneling diode TD 10*a* in Embodiment 1 of the present invention. In FIG. 3, curves and points carrying the same symbols as FIG. 2 have the same meanings, and the description of those curves and points are omitted. In FIG. 3, the symbol 72*a* represents the current flowing to the storage node SN 16 when the access transistor TG 5 is ON. The current 72*a* is a load current determined by the access transistor TG 5 and the high resistance load HR 7. When reading data, the potential of the bit line BIT 1 is set to the voltage Vbit between the voltage Vp at the peak current Ip and the voltage Vv at the valley current Iv of the tunneling diode TD 10*a*. Here, Veq represents the potential when the potential Vbit of the bit line BIT 1 is equal to the potential of the storage node SN 16. Next, the access transistor TG 5 is turned ON. At this time, if the potential of the storage node SN 16 is at a high level (Point C2), the potential of Point C2 is higher than the potential of the bit line BIT 1, Vbit, and the current flows from the storage node SN 16 toward the bit line BIT 1 (72*a*). Whereas, if the potential of the storage node SN 16 is at a low level (Point A1), the potential of Point A2 is lower than the potential Vbit of the bit line BIT 1, and the current flows from the bit line BIT 1 toward the storage node SN 16 (72*a*). In other words, if the storage node SN 16 is at a high level, the potential Vbit of the bit line BIT 1 is elevated, while if the storage node SN 16 is at a low level, the potential Vbit of the bit line BIT 1 is lowered. By sensing this change of the voltage Vbit of the bit line BIT 1 with a sensing amplifier or the like, data stored in the storage node SN 16 can be detected. Also on reading the data, the tunneling diode current 69 must have three stable points (intersections) for the loading current 72. If an unnecessarily large column current flows during data reading, since a single stable state (one intersection) is created, and data in the memory cell is completely destroyed, the column current must be controlled and optimized by the bit-line contact resistor 4*a* shown in FIG. 1.

Figure 4:
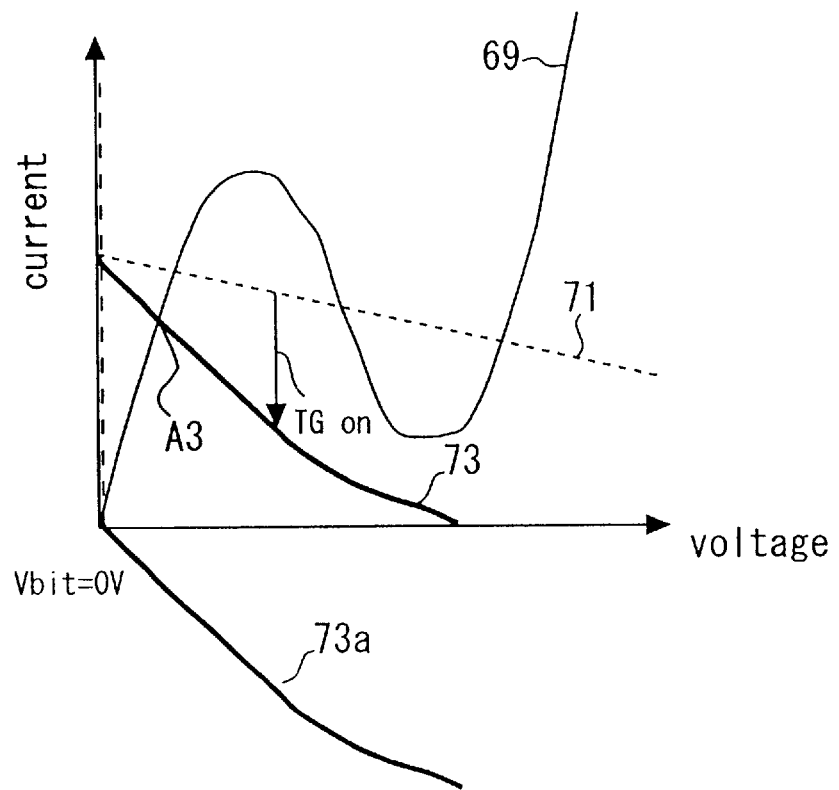
FIG. 4 is a graph showing a method for writing low-level data of an SRAM using the tunneling diode TD 10a according to Embodiment 1 of the present invention.

FIG. 4 is a graph showing a method for writing low-level data of an SRAM using the tunneling diode TD 10*a* according to Embodiment 1 of the present invention. In FIG. 4, since curves and points carrying the same symbols as in FIGS. 2 and 3 are the curves and points having the same meanings, no description will be made repeatedly. In FIG. 4, the symbol 73*a* represents the current flowing into the storage node SN 16 when the access transistor TG 5 in ON. The current 73 is the loading current of the current 73*a*+the current 71. When low-level data are written, the potential of the bit line BIT 1 is set to a low-level potential (Vbit=0 V). Next, the access transistor TG 5 is ON. Then, the column current flows from the storage node SN 16 toward the bit line BIT 1, and the potential of the storage node SN 16 is lowered to a low-level potential (Point A3). Since an unnecessarily large column current leaves the high-level stable point (intersection), the column current must be optimized by the bit-line contact resistor 4*a* shown in FIG. 1.

Figure 5:
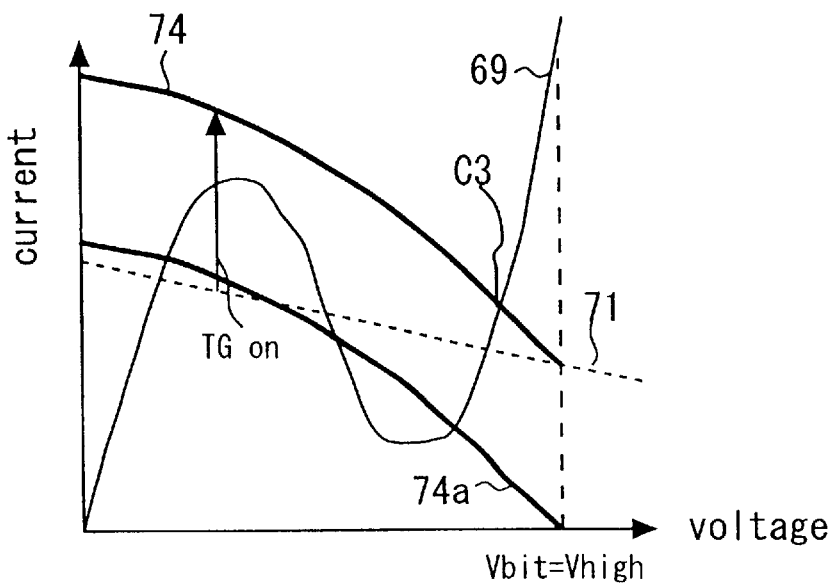
FIG. 5 shows a method for writing the high-level data of an SRAM using a tunneling diode TD 10a according to Embodiment 1 of the present invention.

FIG. 5 shows a method for writing the high-level data of an SRAM using a tunneling diode TD 10*a* according to Embodiment 1 of the present invention. In FIG. 5, since curves and points carrying the same symbols as in FIGS. 2 to 4 are curves and points having the same meanings, the description thereof is omitted. In FIG. 5, the symbol 74*a* is the current flowing into the storage node SN 16 when the access transistor TG 5 is ON. The current 74 is the loading current of current 71+ current 74*a*. For writing high-level data, the potential of the bit line BIT 1 is first set to a high-level potential (Vbit=Vhigh). Next, the access transistor TG 5 is turned ON. The column current flows from the bit line BIT 1 toward the storage node SN 16 elevating the potential of the storage node SN 16 to a high-level potential (Point C3). Since an insufficiently small column current leaves the low-level stable point (intersection), the column current must be optimized by the bit-line contact resistor 4*a* shown in FIG. 1.

According to Embodiment 1 as described above, since two-value data can be read and written by only three elements, the access transistor TG 5, the high resistance load HR 7, and the tunneling diode TD 10*a*, the chip size can be reduced and the costs can be reduced. Even if the peak current (Ip)/valley current (Iv) ratio is relatively large, since the gradient of the loading current can be reduced against the potential of the storage node SN 16 by elevating the resistance of the high resistance load HR 7 and the voltage of the power line Vcc 6, the stable points are shifted expanding the voltage difference between two stable points (two values). As the result, static noise margin and data holding characteristics can be improved.

Embodiment 2

Figure 6:
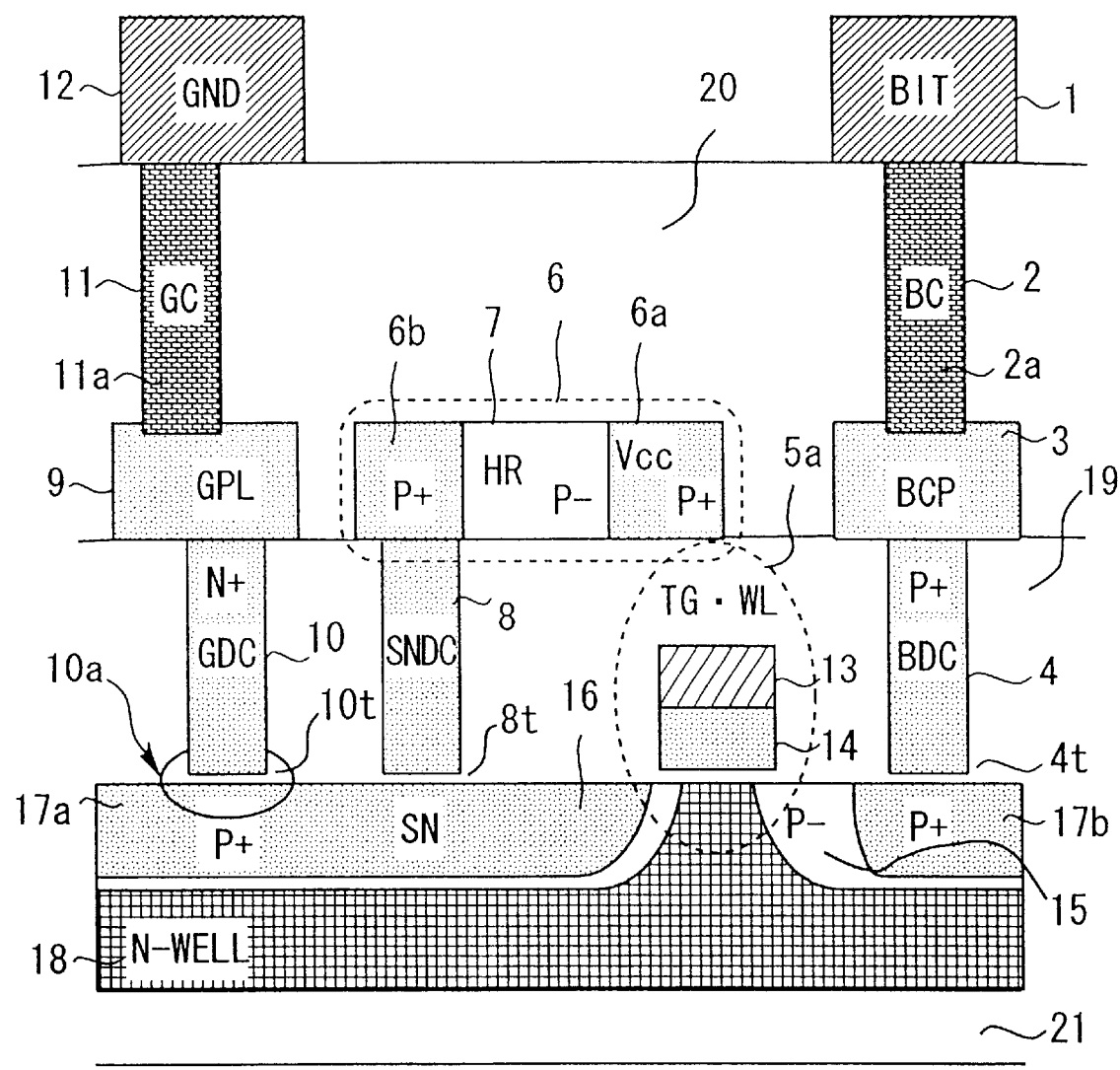
FIG. 6 is a schematic sectional view showing a semiconductor memory according to Embodiment 2 of the present invention.

FIG. 6 is a schematic sectional view showing a semiconductor memory according to Embodiment 2 of the present invention. In FIG. 6, 21 is a P-type silicon substrate (semiconductor substrate), 18 is an N-well (N-WELL) formed on the P-type silicon substrate 21, 17*a* is a P$^+$-type active region (first active region) formed on the N-well 18, 17*b* is a P$^+$-type active region (second active region) formed on the N-well 18, 15 is a P$^-$-type active region formed on the N-well 18, 14 is a P$^+$-doped polysilicon, and 13 is a silicide alloy such as tungsten silicide WSi formed of the polysilicon 14. The gate electrode of the transistor TG 5 is formed of the silicide alloy 13 and polysilicon 14, and the source-drain region of the access transistor TG 5 is formed of the P$^+$-type active region 17a, P$^+$-type active region 17b, and P$^-$-type active region 15.

The symbol 19 represents a first interlayer insulating film. Although the material for the first interlayer insulating film 19 is not specified, a material that does not change the shape of the storage node direct contact SNDC 8 and the like during the film formation of the tunnel insulating film described later is preferable. The first interlayer insulating film 19 is provided with a bit-line (BIT) direct contact (BDC) 4, a storage node direct contact (SNDC) 8, and a ground direct contact (GDC) 10, as contact openings. On the first interlayer insulating film 19 and in the contact openings are polysilicon 3, 6, and 9; the polysilicon 3 is called the bit-line contact pad (BCP), and the polysilicon 9 is called the ground polysilicon (Poly-Si) line (GPL). Polysilicon 3 and 6 is P-type polysilicon, and polysilicon 9 is N-type polysilicon. Polysilicon 6 has a structure having a P− area 7 between P+ areas 6a and 6b; the P+ areas correspond to the power line Vcc, and the P− area 7 corresponds to the loading resistance HR.

Although the polysilicon normally contacts with the active regions at the bottom portion of the contact openings, in Embodiment 2, tunnel insulating films 4t, 8t, and 10t are formed corresponding to respective contacts BDC 4, SNDC 8, and GDC 10, and the polysilicon does not directly contact with the active regions.

The symbol 20 represents a second interlayer insulating film, whose material is not specified as in the first interlayer insulating film 19. The second interlayer insulating film 20 is provided with a bit-line contact (BC) 2 and a ground contact (GC) 11 as contact openings. In each contact opening, metals 2a and 11a, such as tungsten, are embedded, respectively. On the second interlayer insulating film 20 are a bit line BIT 1 and a ground line GND 12 each consisting of aluminum, copper, or an alloy thereof, and connected to polysilicon BCP 3 and polysilicon GPL 9 through a bit-line contact BC 2 and a GND contact GC 11, respectively. Although the first interlayer insulating film 19 and the second interlayer insulating film 20 are films containing silicon dioxide or the like, other materials may be used unless the shape of respective direct contacts or electrical properties aster film formation are affected during the formation of the tunnel insulating film 4t and the like.

Next, the constitution of the tunneling diode 10a causing the tunneling effect will be described. A tunnel insulating film 10t is sandwiched between a P+ active region 17a (P-type) and a GND polysilicon line GPL 9 (N-type). The GND polysilicon line GPL 9 side is connected to the GND line 12, and the P+ active region 17a side corresponds to the storage node SN 16. By changing the potential of the storage node SN 16 side, a tunnel current flows to the GND 12 side through the P+ active region 17a, tunnel insulating film 10t, and the GND polysilicon line GPL 9.

Since an excessive column current of the bit line BIT 1 or the like for selecting memory cells destroys the data of the selected bit on reading, a tunnel insulating film causing the tunneling effect is inserted in the bottom portion of the bit-line direct contact BDC 4 to elevate resistance. Similarly, a tunnel insulating film is inserted in the bottom portion of the storage node direct contact SNDC 8 to elevate the resistance of the high resistance load 7. Furthermore, a tunnel insulating film is inserted in the bottom portion of the ground direct contact GDC 10 to improve the peak/valley ratio of the tunneling diode 10a. As described above, tunnel insulating films are inserted in the bottom portions of all buried contacts such as the bit-line direct contact BDC 4, the storage node direct contact SNDC 8, and the ground direct contact GDC 10, to elevate resistance. As described later, these tunnel insulating films can be formed in a single process. The tunneling diode 10a is formed in the interface between the P+-type active region 17a and the ground direct contact GDC 10. By the tunnel insulating films, the diffusion of impurities to each other can be prevented, although electrons enter into the valence electron zone due to the tunneling effect. Therefore, the deterioration of the properties of the tunneling diode 10a due to heat treatment and the like in the following processes can be prevented. The tunnel insulating film 4t or 8t may be removed depending upon the characteristics of the access transistor.

The power line Vcc 6, the high resistance load HR 7, and the ground polysilicon line GPL 9 are formed by patterning a film of non-doped polysilicon, and selectively implanting impurities. Specifically, selective implantation is performed by making the power line Vcc 6 P$^+$ type, the high resistance load HR 7 P$^-$ type, and the ground polysilicon line GPL 9 N$^+$ type. As described above, by further elevating the resistance of the high resistance load HR 7, then setting the power voltage impressed to the high resistance load HR 7 to be higher than the power voltage impressed to the bit line BIT 1, data holding characteristics can be improved while controlling the column current. By adjusting the concentration of impurities implanted into the high resistance load HR 7, the adjustment such as adding the loading current flowing in the high resistance load HR 7 and the like can be performed.

In order to control the column current of the bit line BIT 1 and the like selecting memory cells, the source-drain region side 15 of the access transistor TG 5 is used as a P$^-$-type active region to elevate drain resistance. It is preferable to control the column current by adjusting the threshold voltage Vth of the access transistor TG 5 and the concentration of P-type impurities in the source-drain region 15, considering the ease of writing, the delay of access time, and the like.

According to Embodiment 2 as described above, an SRAM using negative resistance can be realized by providing a tunnel insulating film on the bottom portion of the ground direst contact 10 forming a tunneling diode 10a. The resistance of the high resistance load HR 7 can be further elevated by providing a tunnel insulating film on the bottom portion of the storage node direct contact SNDC 8, and data holding characteristics can be improved while controlling the column current by setting the power voltage impressed to the high resistance load HR 7 to be higher than the power voltage impressed to the bit line BIT 1. The column current can be controlled and stable data read/write characteristics can be secured by using the drain region side 15 of the access transistor TG 5 as a P$^-$-type active region to elevate drain resistance. The column current can be controlled and stable data read/write characteristics can also be secured by providing a tunnel insulating film on the bottom portion of the bit-line direct contact BDC 4.

Embodiment 3

Figure 7A:
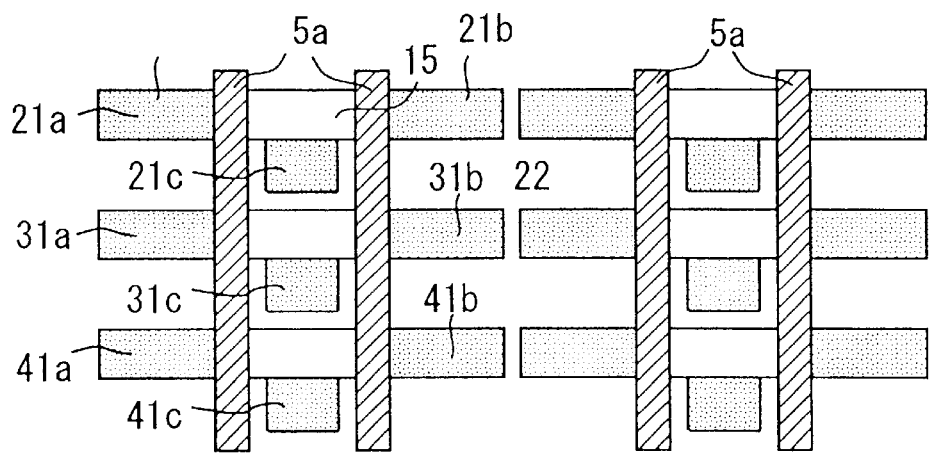
FIGS. 7A to 7C are schematic plan showing a semiconductor memory according to Embodiment 3 of the present invention.
Figure 7B:
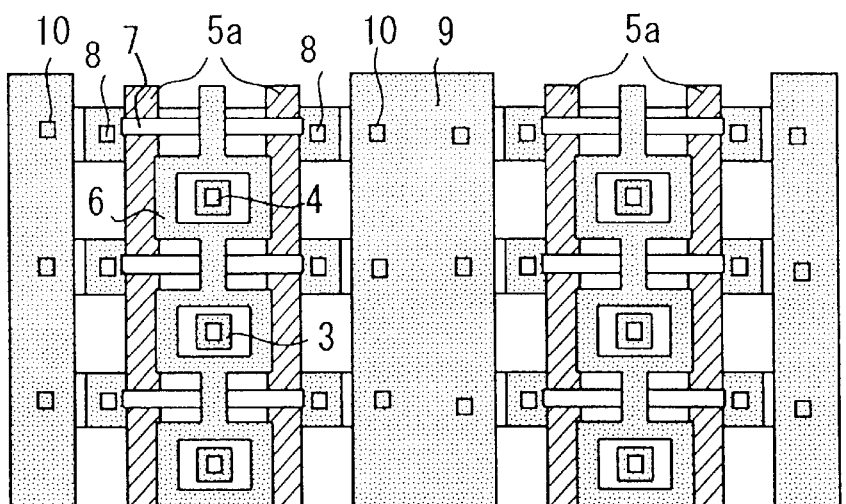
Figure 7C:
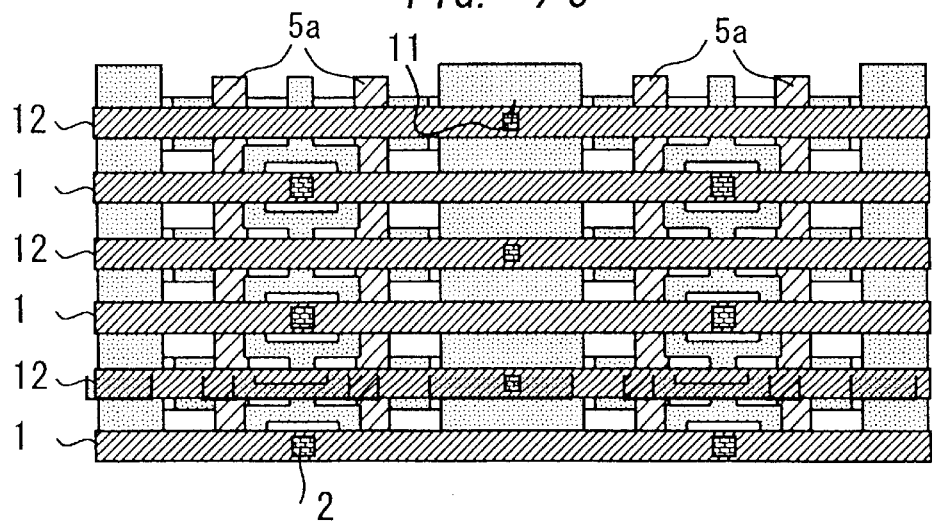

FIGS. 7A to 7C are schematic plan showing a semiconductor memory according to Embodiment 3 of the present invention. in FIGS. 7A to 7C, the parts carrying the same symbols as in FIG. 6 have the same functions, and the description thereof is omitted. As FIG. 7A shows, in the field process, T-shaped active regions (silicon substrate) 21a, 21b, 15 and 21c, 31a, 31b, 15 and 31c, 41a, 41b, 15 and 41c, and the like (hereafter, symbols 21, 31, 41 and the like are used for representing an entire T-shape), and field oxide layers 22 for isolating a plurality of arrayed T-shaped active regions 21, 31, 41 and the like from each other are formed. After forming an N-well 18 so as to surround the T-shaped active regions 21 and the like and growing a gate insulating film, the gate electrodes of the access transistor, also functioning as word lines (first gates) 5a are formed. Since storage nodes SN 16 are formed on the overhung portion 21a and 21b of the T-shaped active region 21, the overhung portion 31a and 31b of the T-shaped active region 31, the overhung portion 41a and 41b of the T-shaped active region 41, and the like, two memory cells 21a and 21b, 31a and 31b, or 41a and 41b, and the like can be formed on T-shaped active regions 21, 31, 41 and the like, respectively. Since the access transistors TG also functioning as the word lines WL (first gates) 5a are used for selecting the memory cell arrays 21a, 31a, 41a, and the like, two pairs of them are provided in parallel so as to intersecting each of T-shaped active regions 21, 31, 41 and the like. One of the two pairs is used for selecting the memory cell arrays 21a, 31a, 41a, and the like, and the other is used for selecting the memory cell arrays 21b, 31b, 41b, and the like. Since the two pairs of the word lines WL (first gates) 5a operate independently, the two memory cells 21a, and 21b or the like formed on one T-shaped active region 21 or the like can be entirely independent. As described above, by providing a plurality of arrayed T-shaped active regions 21 and the like, and providing two independently operating memory cells on one T-shaped active region 21 or the like, the bit density per unit area can be increased, and the reduction of the chip size can be realized.

As described above, since memory cells are formed on the T-shaped active region 21 and the like, and tunneling diodes 10a are formed as described later, the T-shaped active regions 21 and the like are made to be P$^+$-type to form P$^+$ active regions 17a and 17b (see FIG. 6). The source-drain region 15 of the access transistor TG 5 is made to be P$^-$-type for controlling the column current selecting the memory cells and 21a and the like. The optimization of the column current can be adjusted by the concentration of P-type impurities of the source-drain region 15.

After forming and planarizing a first interlayer insulating film 19 of P$^+$ active regions 17a, 17b and the like (see FIG. 6), a ground direct contact GDC 10, a storage node direct contact SNDC 8, and a bit-line direct contact BDC 4 are formed. If the shape of the T-shaped active regions 21 and the like is the shape as shown in FIG. 7A, the location of each of direct contacts GDC 10, SNDC 8, BDC 4, and the like on P$^+$ active regions 17a, 17b and the like is uniquely determined as FIG. 7B shows.

As FIGS. 6 and 7B show, after tunnel insulating films are formed on Si substrates (17a, 17b, etc.) underneath the ground direct contact GDC 10, the storage node direct contact SNDC 8, and the bit-line direct contact BDC 4, a polysilicon (Poly-Si) film is formed over direct contacts GDC 10, SNDC 8, BDC 4 and the like and patterned, then bit-line contact pads 3, the high resistance load HR 7, the power line Vcc 6, and the ground polysilicon line GPL 9 are formed. The bit-line contact pads 3, the high resistance load HR 7, the power line Vcc 6, the ground polysilicon line GPL 9, and the like can be formed by selectively implanting impurities as described for Embodiment 1. The tunneling diode 10a is formed at the bottom portion of the ground direct contact GDC 10.

As FIGS. 6 and 7C show, after the second interlayer insulating film 20 is formed over bit-line contact pads 3, the high resistance load HR 7, the power line Vcc 6, and the ground polysilicon line GPL 9 and the like are formed, the bit-line contact BC 2 and the ground contact GC 11 are formed. The lower end of the bit-line contact BC 2 is connected to the bit-line contact pad 3 on the bit-line direct contact BDC 4, and the upper end of the bit-line contact BC 2 is connected to the bit line BIT 1. The lower end of the ground contact GC 11 is connected to the ground polysilicon line GPL 9 on the ground direct contact GDC 10, and the upper end of the of the ground contact GC 11 is connected to the ground line GND 12. Since the ground polysilicon line GPL 9 is formed by polysilicon being able to have the selection ratio on oxide film etching, the ground contact GC 11 can be dropped onto any location of the ground polysilicon line GPL 9 unless the projection of ground polysilicon line GPL 9 raises a problem. Therefore, the necessity of piling region on the silicon substrate 21 can be eliminated, leading to the reduction of the chip size.

As described above, after forming bit-line contacts BC 2 and the ground contacts GC 11, ground lines GND 12 and bit lines BIT 1 by forming and patterning films of a metal such as aluminum Al or the like. As FIG. 7C shows, ground lines GND 12 and bit lines BIT 1 are arranged alternately. Since a certain number of the ground line GND 12 can be eliminated unless the ground floating of each memory cell raises a problem, the condition of line pitch can be relaxed.

According to Embodiment 3 as described above, since the bit density per unit area can be increased by arraying a plurality of T-shaped active regions 21 and the like, and providing two memory cells that can operate independently on one T-shaped active region 21 and the like, the reduction of chip size can be realized. Since the ground contact GC 11 can be dropped onto any location of the ground polysilicon line GPL 9 unless the projection of ground polysilicon line GPL 9 raises a problem, the necessity of piling region on the silicon substrate 21 can be eliminated, leading to the reduction of the chip size.

Embodiment 4

FIGS. 8A and 8B through 12A and 12B are diagrams showing a method (process flow) for manufacturing a semiconductor memory according to Embodiment 4 of the present invention. In each diagram, (a) and (b) show a sectional view and a plan of the semiconductor memory, respectively. In FIGS. 8A and 8B through 12A and 12B, since the parts carrying the same symbols as in FIG. 6 or 7A to 7C have the same functions, no description is made repeatedly.

Figure 8A:
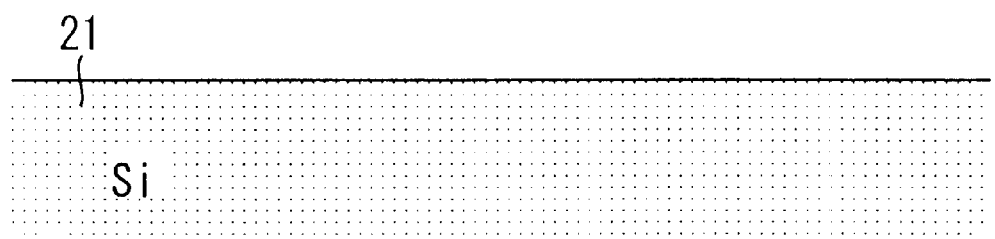
Figure 8B:
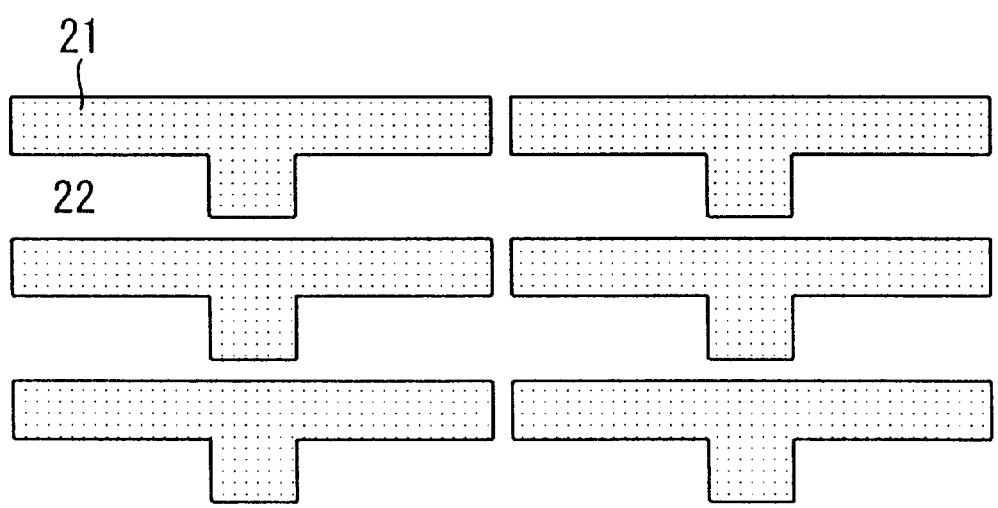

As FIGS. 8A and 8B show, P-type active regions 21 (silicon substrates) are separated by field oxide films 22, and P-type active regions 21 each having a T-shape configuration are arrayed. As described for Embodiment 3, a T-shape configuration is used for increasing bit density per unit area.

Figure 9A:
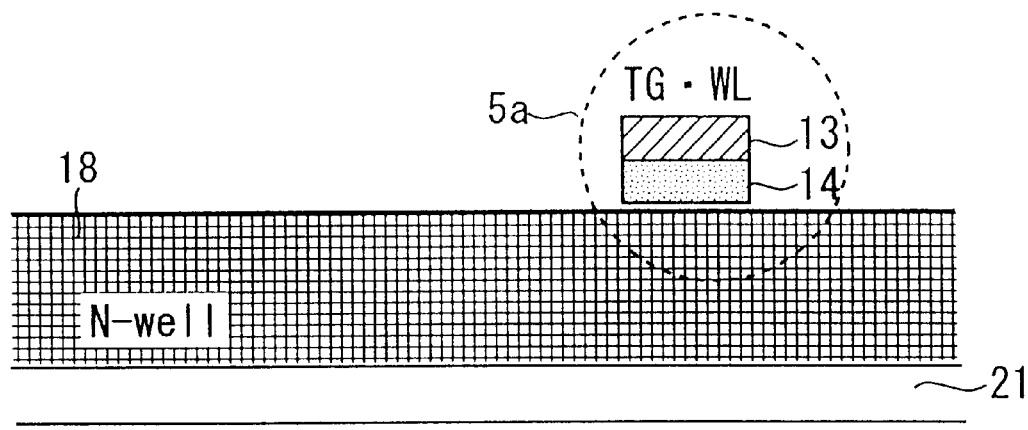
FIGS. 9A and 9B show an N-well 18 which is formed on the T-shaped P-type active regions 21 of each memory cell.
Figure 9B:
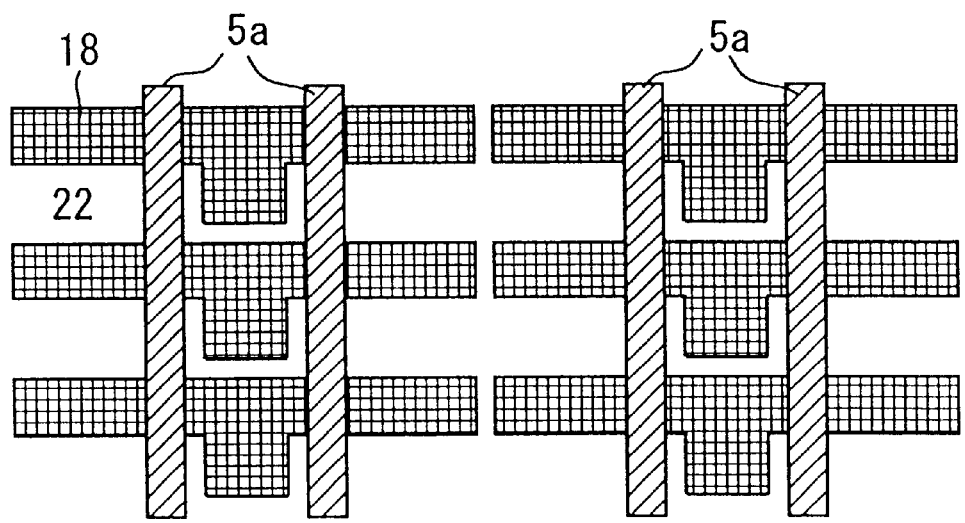

As FIGS. 9A and 9B show, an N-well 18 is formed on the T-shaped P-type active regions 21 of each memory cell. As far as resistance against software errors due to separating margin between P-type active regions 21 and a trace quantity of radioactive rays emitted from Al lines or the like on the chip permits, the method for forming the N-well can be a retrograded well forming method in which the bottom portion of the N-well has a higher ion concentration, or a thermal diffusion well forming method in which the upper portion of the N-well has a higher ion concentration. Thereafter, channel doping is performed to optimize the threshold voltage Vth of the access transistor TG 5. After forming a gate oxide film, word lines WL (first gates) 5a are formed. Since the word lines WL 5a run for a long distance on the memory cell array, it is required to lower the resistance of the word lines WL 5a. Therefore, a silicide structure is used in which a silicide alloy film 13 such as tungsten silicide WSi in formed on polysilicon doped with a P-type impurity (D-poly) 14. However, as far as the resistance is low, any materials may be used for forming the word lines WL 5a, and the silicide structure can be formed by a metal or other materials such as titanium silicide TiSi. The word lines WL (first gates) 5a are formed in parallel to each other on the left overhung portion 21a and the like and on the right overhung portion 21b and the like of each P-type active region 21 and the like.

Figure 10A:
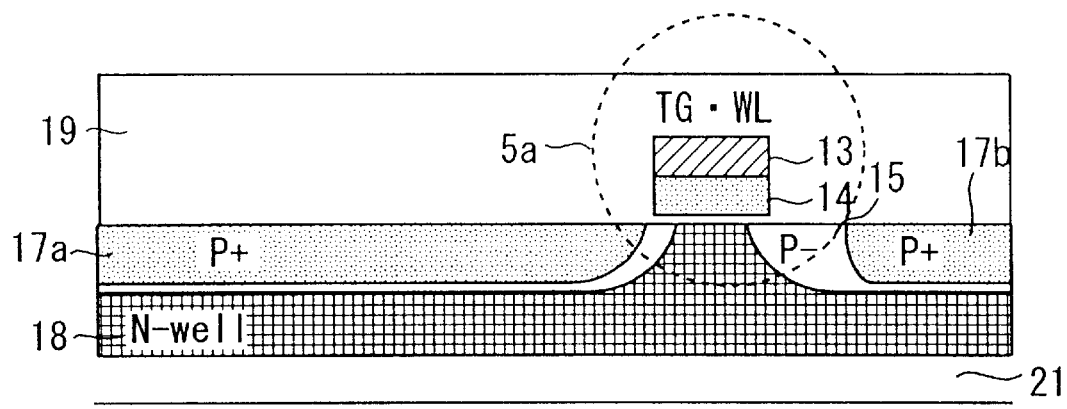
FIGS. 10A and 10B show a P$^-$-type active region 15 which is formed on the drain region side of the access transistor TG 5, by doping a P-type impurity such as boron B.
Figure 10B:
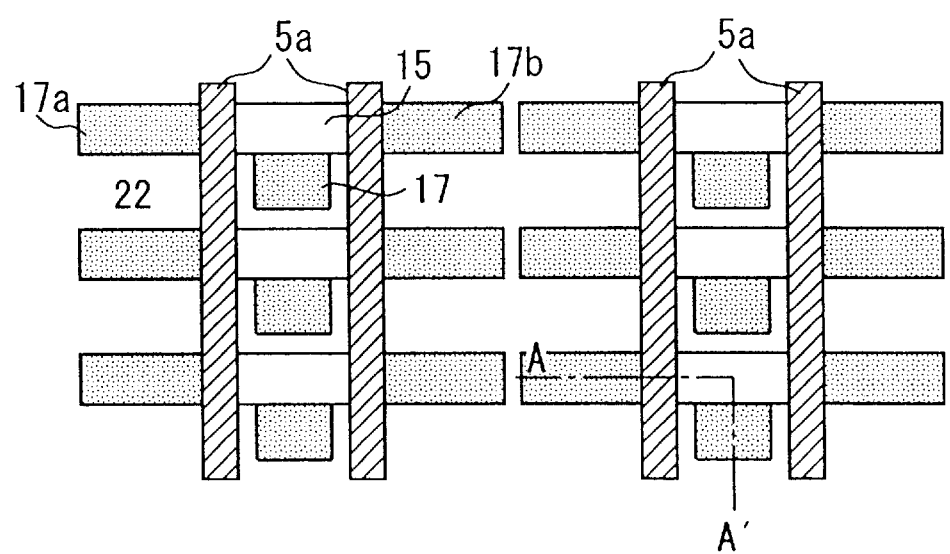

After forming the word lines WL (first gates) 5a, as FIGS. 10A and 10B show, a P⁻-type active region 15 is formed on the drain region side of the access transistor TG 5, by doping a P-type impurity such as boron B. As described in description for Embodiment 2 and the like, this is because the column current must be controlled for preventing data from being destroyed during data reading. Active regions other than the P⁻-type active region 15 are converted to P⁺-type. Since the tunneling diode operates at around 0.4 V, this P⁻-type active region 15 is the portion corresponding to the linear region of an MOS transistor. Thereafter, a first interlayer insulating film 19 (see FIG. 1) is formed and planarized. Although the material for the first interlayer insulating film 19 is not specified, a material not changing the shape of direct contacts 10 etc. during forming the tunnel insulating film in the following process is preferable.

Figure 11A:
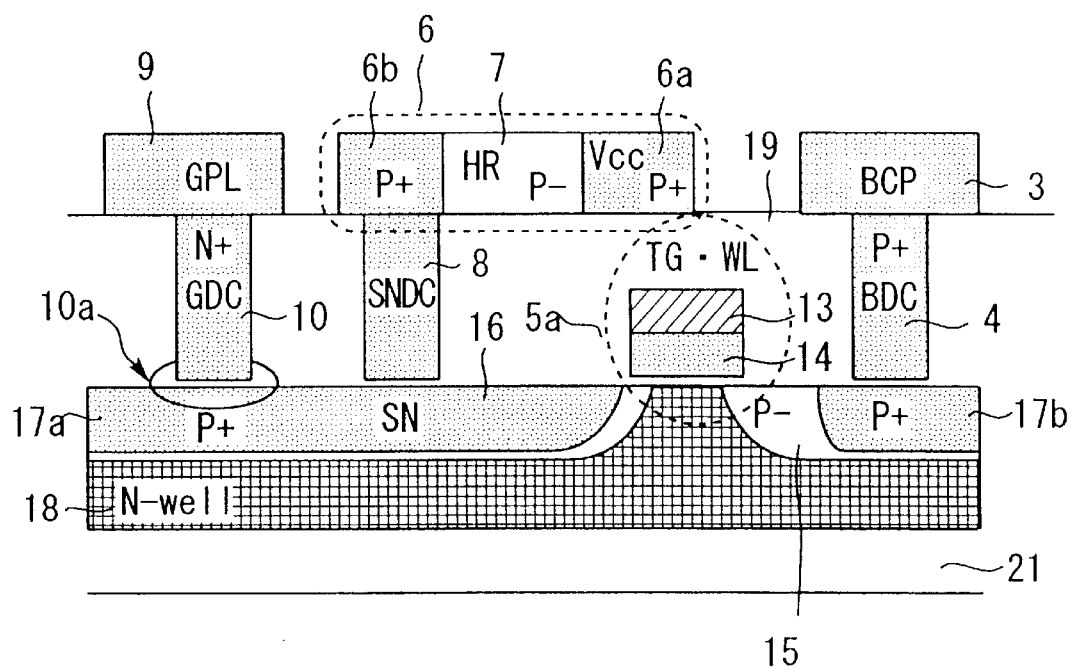
FIGS. 11A and 11B show that ground direct contacts GDC 10, storage node direct contacts SNDC 8, and bit-line direct contact BDC 4 are simultaneously formed.
Figure 11B:
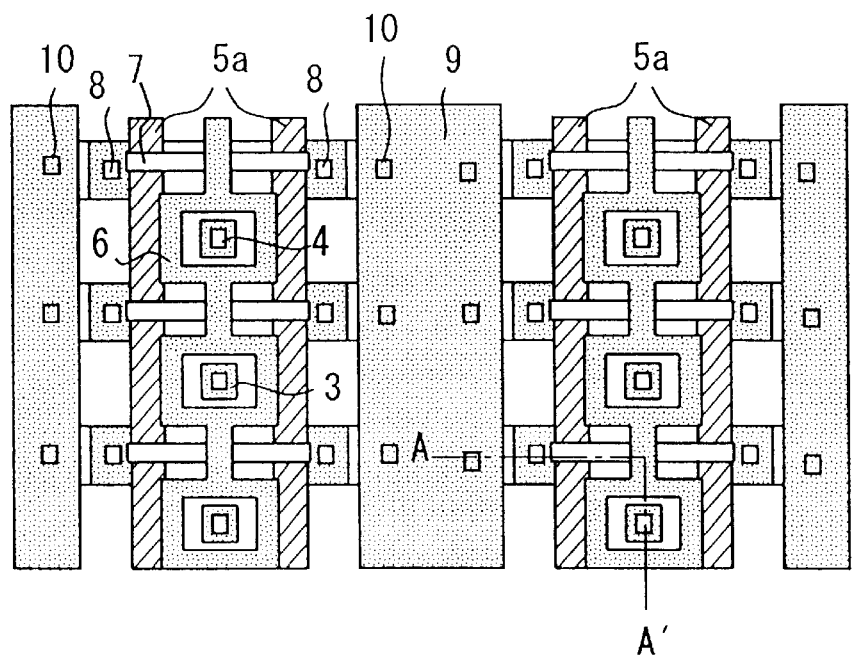

As FIGS. 11A and 11B show, ground direct contacts GDC 10, storage node direct contacts SNDC 8, and bit-line direct contact BDC 4 are simultaneously formed. A tunnel insulating film is formed on Si substrates (17a, 17b, etc.) underneath the ground direct contacts GDC 10, the storage node direct contacts SNDC 8, and the bit-line direct contact BDC 4. The thickness of the tunnel insulating film must be 2.0 nm or less when an oxide film is used. Methods for forming such a very thin oxide film include a method using rapid thermal annealing (RTA), a method using oxidation equipment such as an oxidation furnace, or a method using chemical oxidation by wet oxidation (WET process). As far as the requirements not to deform the direct contacts 10 etc. during processing are met, any method can be used. As described above, by placing a tunnel insulating film underneath the bit-line direct contact BDC 4, the column current can be controlled and stable read/write characteristics can be secured.

Next, polysilicon (Poly-Si) film of the same layer is formed over direct contacts GDC 10, SNDC 8, BDC 4 and the like and patterned to form bit-line contact pads BCP 3, high resistance loads HR 7, power lines Vcc 6 and ground polysilicon lines GPL 9. The bit-line contact pads BCP 3, the high resistance loads HR 7, the power lines Vcc 6 and the ground polysilicon lines GPL 9 can be formed by selectively implanting impurities as described for Embodiment 1. By ion implantation, the ground polysilicon lines GPL 9 are converted to N⁺-type, the high resistance loads HR 7 are converted to P⁻-type, and the power lines Vcc 6 and the bit-line contact pads BCP 3 are converted to P⁺-type. Next, the tunneling diodes 10a are formed underneath the ground direct contacts GDC 10.

As FIGS. 12A and 12B show, a second interlayer insulating film 20 is formed over bit-line contact pads BCP 3, high resistance loads HR 7, power lines Vcc 6 and ground polysilicon lines GPL 9 and the like. The material for the second interlayer insulating film 20 is not specified as in the first interlayer insulating film 19. Next, bit-line contacts BC 2 and ground contacts GC 11 are formed. The bit-line contacts BC 2 are connected to the bit-line contact pads BCP 3, and the ground contacts GC 11 are connected to the ground polysilicon lines GPL 9. As described in description for Example 2, the ground contact GC 11 can be dropped onto any location of the ground polysilicon line GPL 9 unless the projection of ground polysilicon line GPL 9 raises a problem. Therefore, the necessity of piling region on the silicon substrate 21 can be eliminated, leading to the reduction of the chip size.

According to Embodiment 4 as described above, since the bit density per unit area can be increased by arraying a plurality of T-shaped active regions 21 and the like, the reduction of chip size can be realized. By making the drain region side 15 of the access transistor TG 5 function as a P⁻-type active region for elevating drain resistance, the column current can be controlled, and stable data read/write characteristics can be secured. By placing a tunnel insulating film underneath the bit-line direct contact BDC 4, the column current can be controlled, and stable data read/write characteristics can be secured. Since the ground contact GC 11 can be dropped onto any location of the ground polysilicon line GPL 9 unless the projection of ground polysilicon line GPL 9 raises a problem, the necessity of piling region on the silicon substrate 21 can be eliminated, leading to the reduction of the chip size.

According to the semiconductor memory of the present invention and the method of the manufacture thereof, as described above, a semiconductor memory having the improved peak/valley ratio of the tunneling diode and the method for manufacturing such a semiconductor memory can be provided by placing a tunnel insulating film underneath the ground direct contact forming the tunneling diode, even if the tunneling diode has a small peak/valley ratio.

According to the semiconductor memory of the present invention and the method of the manufacture thereof, by placing a tunnel insulating film underneath the storage node direct contact, the resistance of the high resistance load can further be elevated; and by setting power voltage impressed to the high resistance load to be higher than power voltage impressed to the bit line, data holding characteristics can be improved while controlling the column current. By making the drain region side of the access transistor function as a P⁻-type active region for elevating drain resistance, the column current can be controlled, and stable data read/write characteristics can be secured. By placing a tunnel insulating film underneath the bit-line direct contact, the column current can be controlled, and stable data read/write characteristics can be secured.

Furthermore, according to the semiconductor memory of the present invention and the method of the manufacture thereof, since the bit density per unit area can be increased by arraying a plurality of T-shaped active regions 21 and the like, and providing two memory cells that can operate independently on one T-shaped active region 21 and the like, the reduction of chip size can be realized. Since the ground contact GC 11 can be dropped onto any location of the ground polysilicon line GPL 9 unless the projection of ground polysilicon line GPL 9 raises a problem, the necessity of piling region on the silicon substrate 21 can be eliminated, leading to the reduction of the chip size.

In the semiconductor memory, a resistor may be provided between the source region of the access transistor and the bit line, and/or between the loading resistor and the storage node.

In the semiconductor memory, the resistor may be a tunnel insulating film formed between the active region of the first conductivity type having a relatively high impurity concentration, and polysilicon on the active region.

In the semiconductor memory, the semiconductor memory may perform read operation under the condition where the potential of the bit line is set between the peak voltage across the negative resistor portion when the electric current flowing in the negative resistor portion is a maximum, and the valley voltage across the negative resistor portion when the electric current flowing in the negative resistor portion is a minimum.

In the semiconductor memory, the negative resistor portion may be a tunnel diode.

Here, the semiconductor memory may further comprise between the bitline direct contact and the bit line, a bit-line contact pad formed by forming a polysilicon film on the bit-line direct contact; and a bit-line contact placed on the bit-line contact pad, wherein the bit line is formed on the bit-line contact, and a tunnel insulating film producing the tunneling effect is provided on the bottom portion of the bit-line direct contact.

In the semiconductor memory, the bit-line contact pad, the ground polysilicon wiring, the power line and the loading resistor may be formed on the same layer.

In the semiconductor memory, active regions each being T-shaped may be isolated by field oxide films and are arranged in an array.

In the semiconductor memory, the drain region of the access transistor may be of the first conductivity type having a relatively low impurity concentration.

The present invention has been described in detail with respect to various embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

The entire disclosure of Japanese Patent Application No. 11-238981 filed on Aug. 25, 1999 including specification, claims, drawings and summary are incorporated herein by reference in its entirety.

What is claimed is:

1. A semiconductor memory selected by a bit line and a word line comprising:
   an access transistor whose source-drain region side is connected to said bit line and whose gate side is connected to said word line;
   a loading resistor connected between a power source and a storage node on the drain region side of said access transistor; and
   a negative resistor portion connected between ground and the storage node on the drain region side of said access transistor,
   wherein:
      said negative resistor portion has a tunnel insulating film which produces the tunnel effect and is formed on the p-type active region, and has n-type polysilicon formed in said tunnel insulating film, and
      the drain region of said access transistor includes a P-type region forming. a negative resistor portion.

2. The semiconductor memory according to claim 1, wherein a resistor is provided between the source region of said access transistor and said bit line, and/or between said loading resistor and said storage node.

3. The semiconductor memory according to claim 2, wherein said resistor is a tunnel insulating film formed between the active region of the first conductivity type having a relatively high impurity concentration, and polysilicon on said active region.

4. The semiconductor memory according to claim 3, wherein said semiconductor memory performs read operation under the condition where the potential of said bit line is set between the peak voltage across said negative resistor portion when the electric current flowing in said negative resistor portion is a maximum, and the valley voltage across said negative resistor portion when the electric current flowing in said negative resistor portion is a minimum.

5. The semiconductor memory according to claim 3, wherein said negative resistor portion is a tunnel diode.

6. The semiconductor memory according to claim 2, wherein said semiconductor memory performs read operation under the condition where the potential of said bit line is set between the peak voltage across said negative resistor portion when the electric current flowing in said negative resistor portion is a maximum, and the valley voltage across said negative resistor portion when the electric current flowing in said negative resistor portion is a minimum.

7. The semiconductor memory according to claim 2, wherein said negative resistor portion is a tunnel diode.

8. The semiconductor memory according to claim 1, wherein said semiconductor memory performs read operation under the condition where the potential of said bit line is set between the peak voltage across said negative resistor portion when the electric current flowing in said negative resistor portion is a maximum, and the valley voltage across said negative resistor portion when the electric current flowing in said negative resistor portion is a minimum.

9. The semiconductor memory according to claim 1, wherein said negative resistor portion is a tunnel diode.

10. A semiconductor memory comprising
    a semiconductor substrate of the first conductivity type;
    a well of the second conductivity type formed on the main surface of said semiconductor substrate of the first conductivity type;
    a first active region of the first conductivity type formed on said well of the second conductivity type, and having a relatively high impurity concentration;
    an access transistor whose source region side is connected to the storage node formed in said first active region;
    a second active region of the first conductivity type formed on said well of the second conductivity type other than the area of said first active region and said access transistor, and having a relatively high impurity concentration;
    a storage node direct contact formed on the upper portion of said storage node;
    a loading resistor connected between said storage node and the power line;
    a bit-line direct contact formed on the upper portion of said second active region;
    a bit line formed through said bit-line direct contact;
    a ground direct contact formed on the upper portion of said first active region;
    a polysilicon ground wiring formed by forming a polysilicon film on said ground direct contact;
    a ground contact placed on said polysilicon ground wiring; and
    a ground line formed on said ground contact,
    wherein a tunnel insulating film producing the tunneling effect is provided on the bottom portion of said ground direct contact.

11. The semiconductor memory according to claim 10, further comprising between said bit-line direct contact and said bit line, a bit-line contact pad formed by forming a polysilicon film on said bit-line direct contact; and a bit-line contact placed on said bit-line contact pad, wherein said bit line is formed on said bit-line contact, and a tunnel insulating film producing the tunneling effect is provided on the bottom portion of said bit-line direct contact.

12. The semiconductor memory according to claim 11, wherein said bit-line contact pad, said ground polysilicon wiring, said power line and said loading resistor are formed on the same layer.

13. The semiconductor memory according to claim 12, wherein active regions each being T-shaped are isolated by field oxide films and are arranged in an array.

14. The semiconductor memory according to claim 12, wherein the drain region of said access transistor is of the first conductivity type having a relatively low impurity concentration.

15. The semiconductor memory according to claim 11, wherein active regions each being T-shaped are isolated by field oxide films and are arranged in an array.

16. The semiconductor memory according to claim 11, wherein the drain region of said access transistor is of the first conductivity type having a relatively low impurity concentration.

17. The semiconductor memory according to claim 10, wherein said bitline contact pad, said ground polysilicon wiring, said power line and said loading resistor are formed on the same layer.

18. The semiconductor memory according to claim 10, wherein active regions each being T-shaped are isolated by field oxide films and are arranged in an array.

19. The semiconductor memory according to claim 10, wherein the drain region of said access transistor is of the first conductivity type having a relatively low impurity concentration.

20. The semiconductor memory according to claim 1, wherein said tunnel insulating film of said negative resistor portion is formed on the p-type active region with a relatively high impurity concentration.

* * * * *